(12) United States Patent
Zeng

(10) Patent No.: US 10,806,042 B2
(45) Date of Patent: Oct. 13, 2020

(54) FUNCTIONAL DEVICE, ELECTRONIC APPARATUS, AND MOBILE TERMINAL

(71) Applicant: GUANGDONG OPPO MOBILE TELECOMMUNICATIONS CORP., LTD., Dongguan, Guangdong (CN)

(72) Inventor: Yuanqing Zeng, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/999,291

(22) Filed: Aug. 16, 2018

(65) Prior Publication Data

US 2019/0132971 A1 May 2, 2019

(30) Foreign Application Priority Data

Oct. 31, 2017 (CN) .......................... 2017 1 1062685
Oct. 31, 2017 (CN) ...................... 2017 2 1431565 U

(51) Int. Cl.
| | |
|---|---|
| *H05K 5/02* | (2006.01) |
| *H04M 1/02* | (2006.01) |
| *H01F 7/06* | (2006.01) |
| *H05K 1/02* | (2006.01) |
| *H05K 5/00* | (2006.01) |
| *H05K 7/14* | (2006.01) |

(52) U.S. Cl.
CPC ............. *H05K 5/0217* (2013.01); *H01F 7/06* (2013.01); *H04M 1/0202* (2013.01);
(Continued)

(58) Field of Classification Search
CPC .. H05K 5/0217; H05K 5/0004; H05K 5/0017; H05K 1/028; H05K 5/0086;
(Continued)

(56) References Cited

U.S. PATENT DOCUMENTS 5,977,888 A * 11/1999 Fujita ................... H01H 13/705
341/34
10,444,802 B2 * 10/2019 Zeng .................... H04N 5/2253
(Continued)

FOREIGN PATENT DOCUMENTS

CN      106850896     *  6/2013   .......... H04M 1/0264
CN      103338327 A      10/2013
(Continued)

OTHER PUBLICATIONS

Abstract of CN106850896 (Year: 2017).*
Translation of WO2016197591 (Year: 2016).*

*Primary Examiner* — Daniel P Wicklund
*Assistant Examiner* — Sagar Shrestha
(74) *Attorney, Agent, or Firm* — Ladas & Parry LLP

(57) ABSTRACT

A functional device may include a base defining a cavity, a functional component received in the cavity and a magnetic assembly received in the cavity. The magnetic assembly may include a first magnetic element fixed on the functional component, a second magnetic element fixed on the base and at least one third magnetic element arranged between the first magnetic element and the second magnetic element. When each of the first, second, and at least one third magnetic elements is repulsed to an adjacent magnetic element, the functional component is forced to extend out of the cavity. When each of the first, second, and at least one third magnetic elements is attracted to the adjacent one, the functional component is pulled to retract into the cavity.

20 Claims, 15 Drawing Sheets

(52) U.S. Cl.
CPC ....... *H04M 1/0235* (2013.01); *H04M 1/0237* (2013.01); *H04M 1/0264* (2013.01); *H05K 1/028* (2013.01); *H05K 5/0004* (2013.01); *H05K 5/0017* (2013.01); *H05K 5/0086* (2013.01); *H05K 7/1427* (2013.01); *H04M 2250/52* (2013.01)

(58) Field of Classification Search
CPC ......... H05K 7/1427; H01F 7/06; H01F 7/122; H04M 1/0237; H04M 1/0235; H04M 1/0202; H04M 1/0264; H04M 2250/52
See application file for complete search history.

(56) References Cited

U.S. PATENT DOCUMENTS

| | | | | |
|---|---|---|---|---|
| 2005/0014527 | A1* | 1/2005 | Chambers | H04M 1/0264 455/556.1 |
| 2007/0171551 | A1* | 7/2007 | Tsai | G02B 7/04 359/813 |
| 2008/0139261 | A1 | 6/2008 | Cho et al. | |
| 2009/0075692 | A1 | 3/2009 | Park et al. | |
| 2011/0115924 | A1* | 5/2011 | Yu | G06F 1/1605 348/207.11 |
| 2014/0105682 | A1 | 4/2014 | Chen | |
| 2018/0262663 | A1* | 9/2018 | Zhang | G03B 29/00 |
| 2018/0278853 | A1* | 9/2018 | Ryu | H04N 5/243 |
| 2019/0342432 | A1* | 11/2019 | Chen | H04M 1/0235 |

FOREIGN PATENT DOCUMENTS

| | | | | |
|---|---|---|---|---|
| CN | 204856312 U | | 12/2015 | |
| CN | 107171126 A | | 9/2017 | |
| CN | 2017118136 U | | 3/2018 | |
| WO | WO 2016197591 | * | 12/2016 | ............... G06F 1/16 |

* cited by examiner

FUNCTIONAL DEVICE, ELECTRONIC APPARATUS, AND MOBILE TERMINAL

CROSS REFERENCE TO RELATED APPLICATIONS

This application claims priorities to Chinese Patent Application No. 201721431565.0, filed on Oct. 31, 2017, and Chinese Patent Application No. 201711062685.2, filed on Oct. 31, 2017, the contents of which are herein incorporated by reference in their entireties.

TECHNICAL FIELD

The described embodiments relate to electronic products, and in particular to a functional device with a movable functional component, an electronic apparatus and a mobile terminal with a slidable device.

BACKGROUND

Functional components could increase function of a mobile terminal. However, volume of the mobile terminal is also increased because of the functional components, which may cause troubles such as inconvenience of carrying or gripping.

BRIEF DESCRIPTION OF THE DRAWINGS

In order to make the technical solution described in the embodiments of the present disclosure more clear, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

Figure 1:
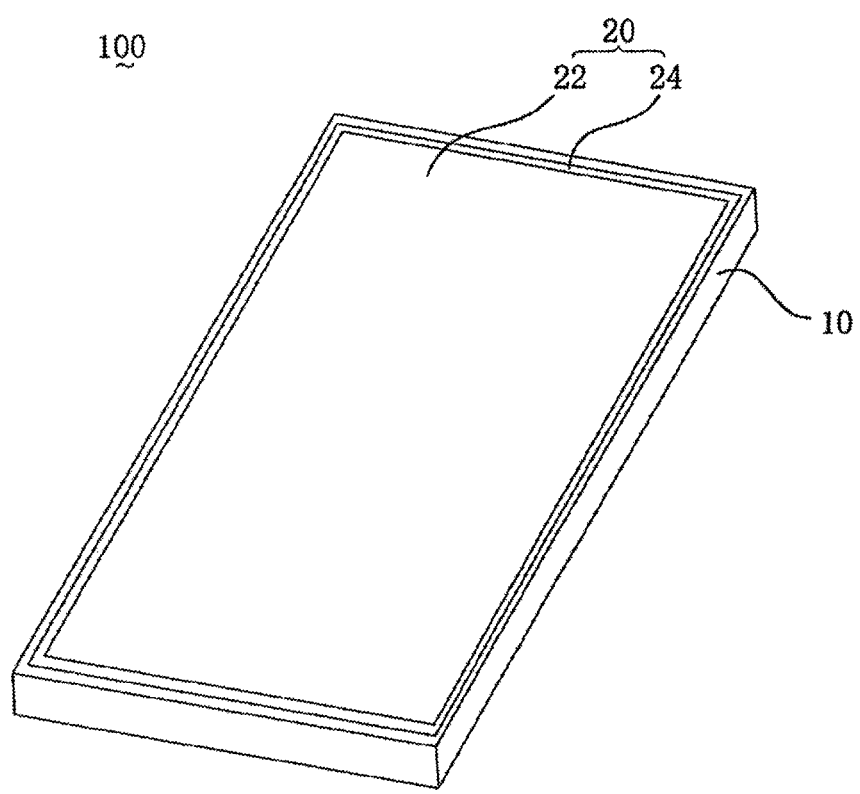
FIG. 1 is a schematic view of an electronic apparatus according to an embodiment of the present disclosure.

In order to more clearly understand the objective, the features and advantages of the present disclosure, the present disclosure will be described in details with reference to the drawings and the embodiments. It should be noted that, the embodiments and the features recited in the embodiments of the present disclosure may be combined with each other without confliction.

Plenty of specific details are described in the embodiments in order to better understand the technical solution of the present disclosure. However, the embodiments described here are only some exemplary embodiments, not all the embodiments. Based on the embodiments described in the present disclosure, one skilled in the art may acquire all other embodiments without any creative work. All these shall be covered within the protection scope of the present disclosure.

Further, the embodiments are described with reference to the accompanying drawings, in order to illustrate specific embodiments of the present disclosure that can be implemented. In the specification, it can be understood that, directional terms recited in the present disclosure, such as "top", "bottom", "upper", "lower", "front", "rear", "left", "right", "inner", "outer", "side plate", "above", "under", and the like, refer to the orientations in the accompanying drawings. Thus, the directional terms used here are only for better and more clearly describing and understanding the present disclosure, and are not intended to indicate or imply that the devices or the elements are disposed to locate at the specific directions or are structured and performed in the specific directions, which could not to be understood as limiting the present disclosure. In the present disclosure, unless specified or limited, otherwise, terms "mounted", "connected", "coupled", "disposed", "arranged", and the like are used in a broad sense, and may include, for example, fixed connections, detachable connections, or integral connections; may also be mechanical or electrical connections; may also be direct connections or indirect connections via intervening structures; may also be inner communications of two elements, as can be understood by those skilled in the art depending on specific contexts.

In addition, terms such as "first", "second", "third", and the like are used herein for purposes of description, and are not intended to indicate or imply relative importance or significance or to imply the number of indicated technical features. Thus, the feature defined with "first", "second", "third", and the like may include one or more of such a feature. In the description of the present disclosure, "multiple" means two or more, unless specified otherwise. Moreover, the terms "comprise", "include" or any other variations thereof are meant to cover non-exclusive including, so that the process, method, article or device comprising a series of elements do not only include those elements, but also include other elements that are not explicitly listed or also include the inherent elements of the process, method, article or device. In the case that there are no more restrictions, an element qualified by the statement "comprises a . . . " does not exclude the presence of additional identical elements in the process, method, article or device that includes the said element.

In the following, an electronic apparatus 100 provided in embodiments of the present disclosure will be described with reference to drawings.

The electronic apparatus 100 may include intelligent devices such as tablet PCs, mobile terminals, cameras, personal computers, laptops, in-vehicle devices, wearable equipment, and the like. It should be understood that "electronic apparatus 100" in the present disclosure may include, but be not limited to an apparatus receiving/transmitting communication signals via wired connection, for example, public switched telephone network (PSTN), digital subscriber line (DSL), digital cable, electric cable and/or another data connection/network, and/or cellular network, Wireless Area Networks (WLAN), digital television network such as DVB-H (Digital Video Broadcasting Handheld) network, satellite network, AM-FM broadcast transmitter and/or another communication terminal of wireless interface. The electronic apparatus 100 may also include a satellite or cellular telephone, a personal communication system terminal with cellular radio telephone and data processing, facsimile and data communication, beeper, or other electronic apparatuses with a transceiver.

Referring to FIGS. 1 to 4, the electronic apparatus 100, according to an exemplary embodiment, may include a housing 10, a screen 20 engaged with the housing 10, a slidable device 30 disposed in the housing 10 and under the screen 10, a driving mechanism 40 received in the housing 10 and configured to drive the slidable device 30 to move.

The housing 10, which may sometimes be referred to as a case or a shell, may be formed of plastic, glass, ceramics, fiber composites, metal (e.g., stainless steel, aluminum, etc.), other suitable materials, or a combination of these materials. In some situations, parts of housing 10 may be formed from dielectric or other low-conductivity material. In other situations, the housing 10 or at least some of the structures that make up the housing 10 may be formed from metal elements. In some embodiments, the housing 10 may act as a base of the slidable device 30. In other embodiments, the housing 10 may include a front shell and a back shell connected to the front shell.

Figure 4:
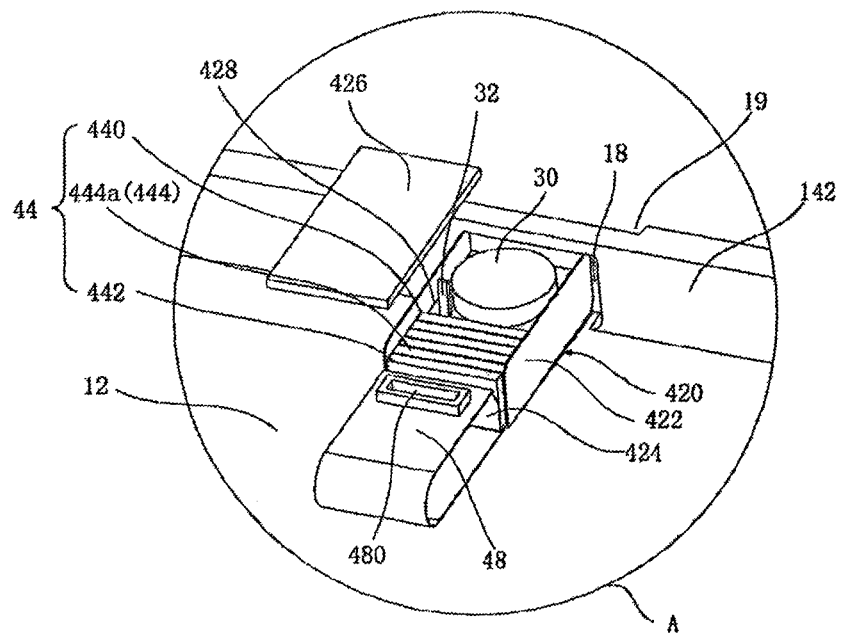
FIG. 4 is an enlarged view of circle A in FIG. 3.

In an embodiment, the housing 10 may have a rectangular configuration and include a bottom board 12 and a side board 14 connected to and surrounding the bottom board 12. The bottom board 12 and the side board 14 may define a cavity 16, which may also be called as a chamber, to receive the slidable device 30 and the driving mechanism 40. The side board 14 may include a first housing wall 142, a second housing wall 144 opposite to the first housing wall 142, and two third housing walls 146 opposite to each other and connected to the first housing wall 142 and the second housing wall 144. In this case, a through hole 18 may be defined by the first housing wall 142 of the side board 14. Furthermore, a slot 19 at an outer side of the first housing wall 142 and around the through hole 18 may be defined by the first housing wall 142, as shown in FIG. 4. Alternatively, the housing 10 may have other configurations, such as round, long round and ellipse etc.

In some embodiments, electronically components 50, such as, a main board (not labeled) and a battery (not labeled) etc., may be received in the cavity 16. In particularly, the electronically components 50 may be arranged between the screen 20 and the housing 10. In some embodiments, an antenna slot (not shown) may be defined in the housing 10, and it may be communicated with an antenna component inside the housing 10.

The screen 20, according to an exemplary embodiment, may include a display area 22 configured to display images and information and a non-display area 24. In some embodiments, the screen 20 may include pixels formed from light-emitting diodes (LEDs), organic LEDs (OLEDs), plasma cells, electrowetting pixels, electrophoretic pixels, liquid crystal display (LCD) components, or other suitable pixel structures. A screen cover layer such as a layer of clear glass or plastic may cover the surface of the screen 20 or the outermost layer of the screen 20 may be formed from a color filter layer, thin-film transistor layer, or other display layer. In this embodiment, the screen 20 may further incorporate touch electrodes and be used as a touch screen for inputting information.

Figure 2:
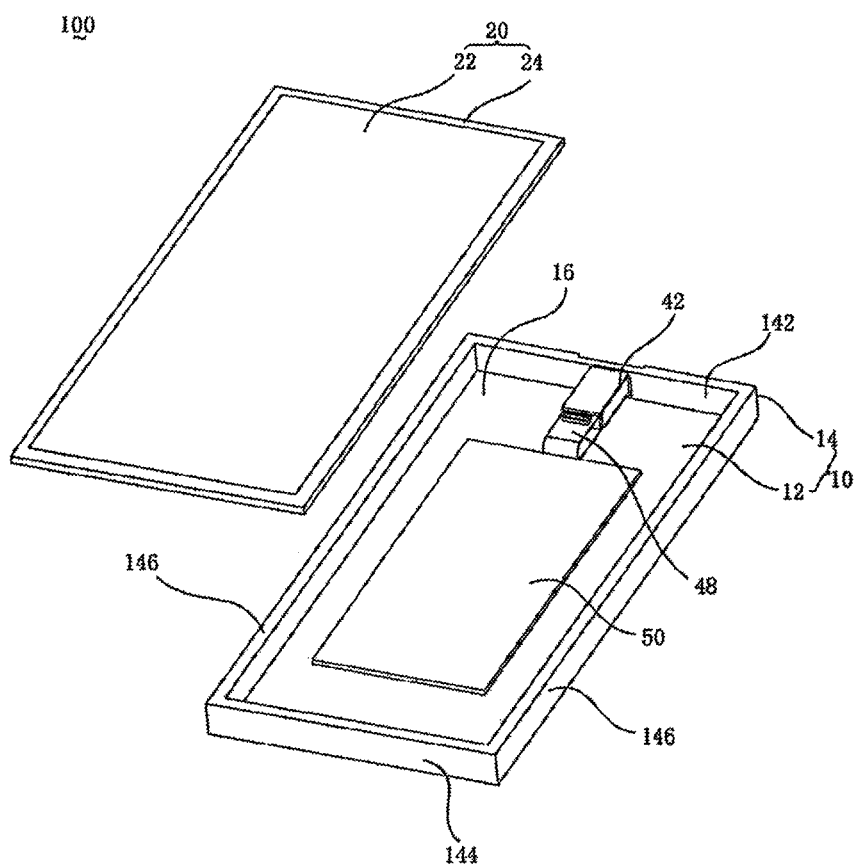
FIG. 2 is a partial exploded view of the electronic apparatus of FIG. 1.
Figure 5:
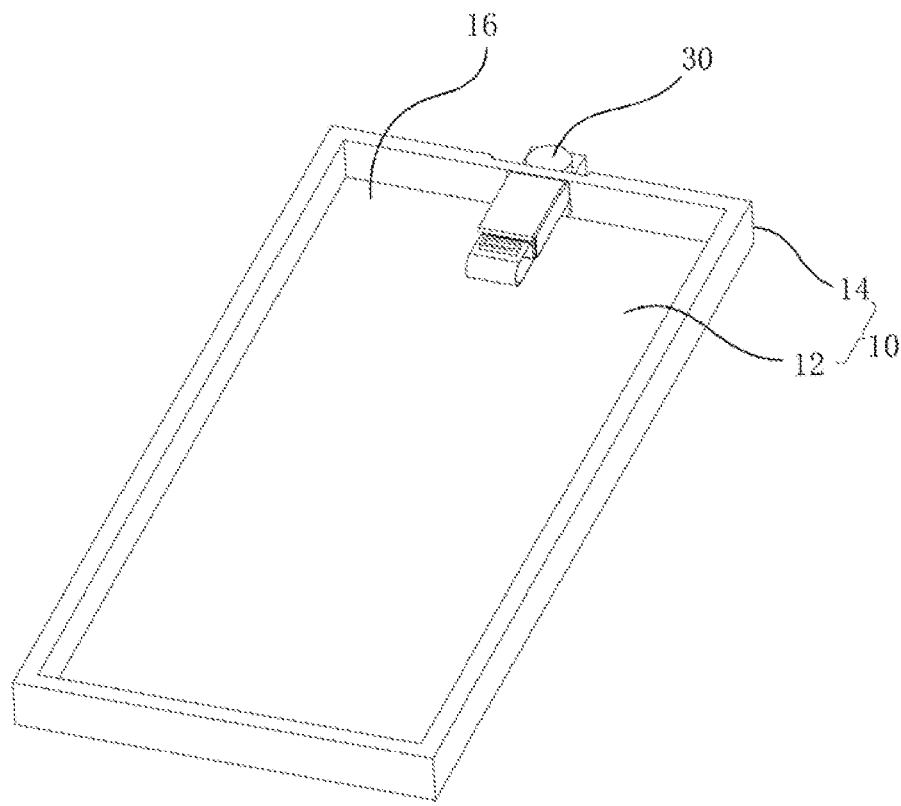
FIG. 5 is a partial schematic view of the electronic apparatus according to an embodiment of the present disclosure, wherein the slidable device is at a first position.

Referring to FIG. 5 and combining with FIG. 2, the slidable device 30, which may also be called as a functional component in the present embodiment, may be configured to move between a first position at which the slidable device 30 extends out of the cavity 16 and a second position at which the slidable device 30 retracts into the cavity 16. Specifically, the slidable device 30 may extend out of the housing 10 or retract back into the housing 10 through the through hole 18. Moving direction of the slidable device 30 may be paralleled to the bottom board 12.

Figure 6:
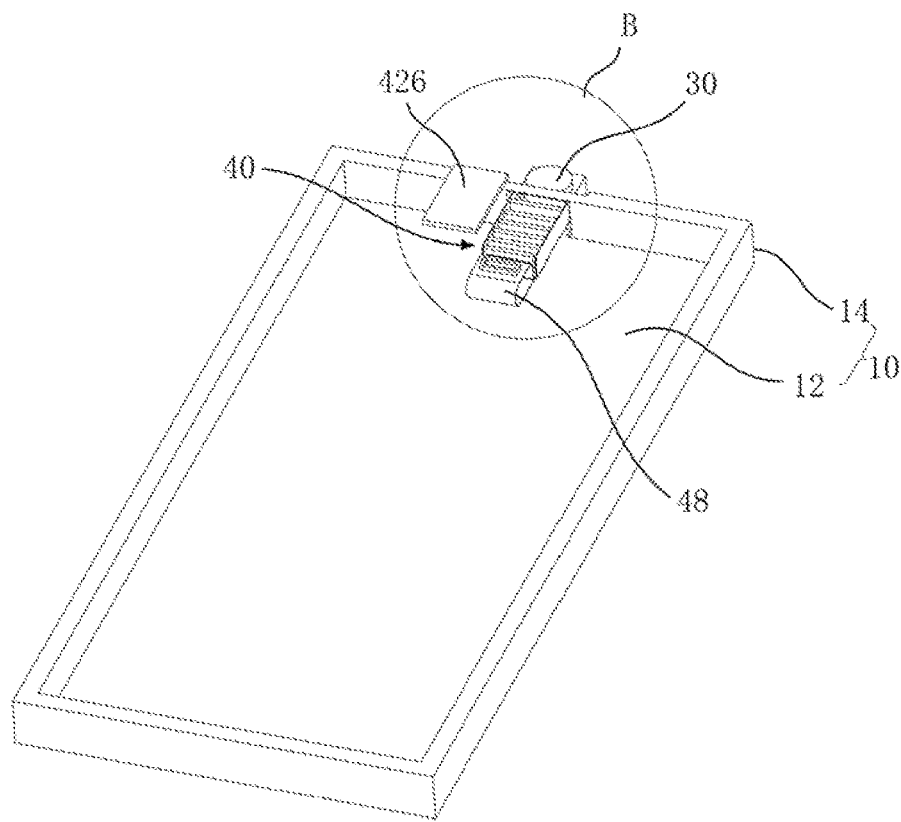
FIG. 6 is a partial disassembly schematic view of the electronic apparatus in FIG. 5.
Figure 7:
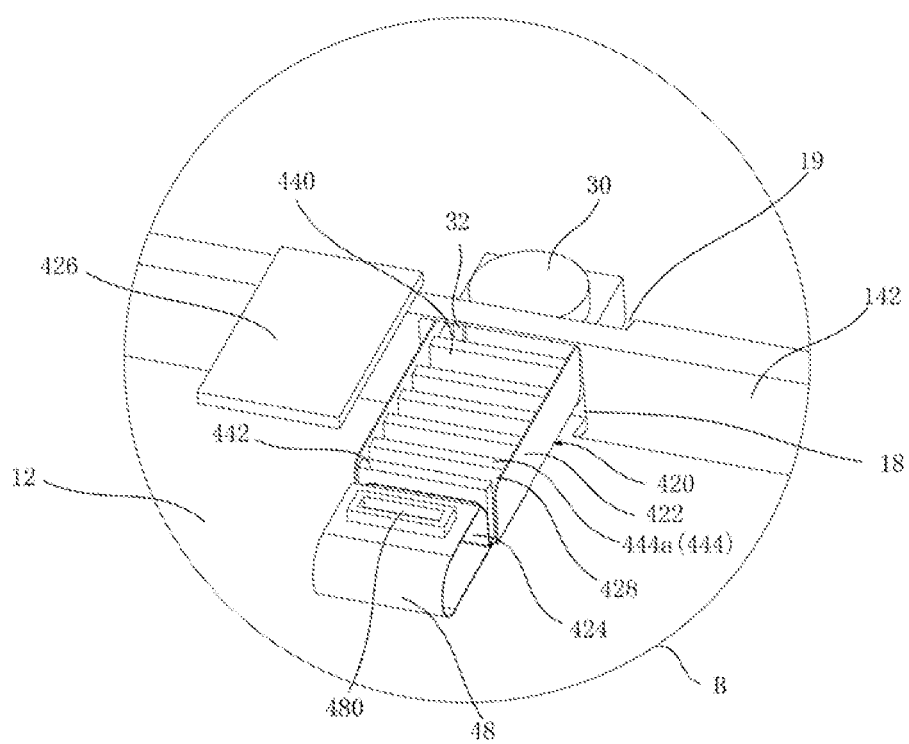
FIG. 7 is an enlarged view of circle B in FIG. 6.

Referring to FIGS. 6 and 7, when the slidable device 30 is at the first position, the slidable device 30 may extend out of the housing 10 and be seen from an outside of the electronic apparatus 100, such that the slidable device 30 could be used to achieve its function. In order to stop the movement of the sliding device 30 when the sliding device 30 is at the first position, a stop protrusion 32 matching with the first housing wall 142 to stop the movement of the sliding device 30 may be arranged on the slidable device 30. For example, when the sliding device 30 moves to the first position, the stop protrusion 32 may abut against the first housing wall 142, as a result, the sliding device 30 is stopped from moving.

Figure 3:
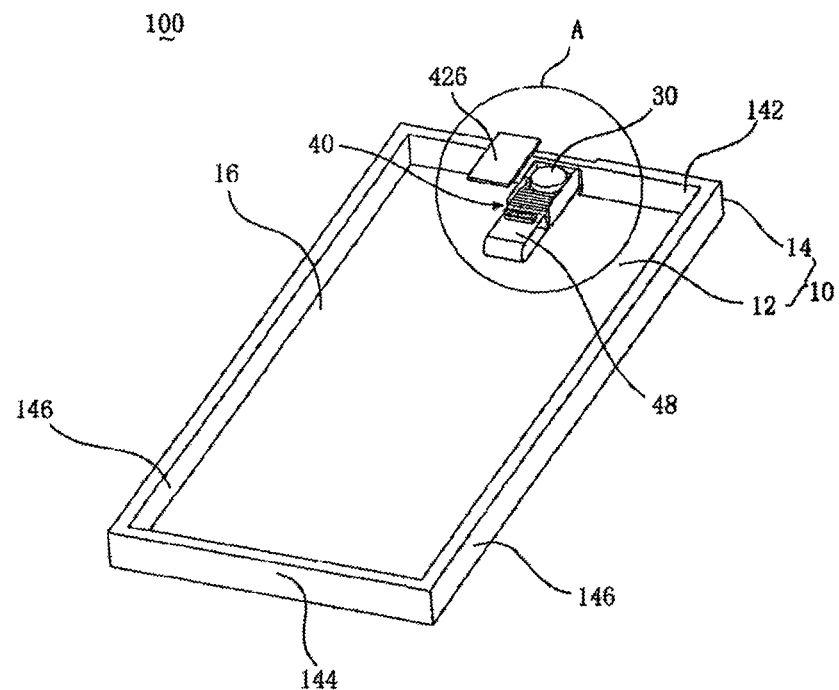
FIG. 3 is a partial schematic view of the electronic apparatus in FIG. 2, wherein the slidable device is at a second position.

As shown in FIGS. 2-4, when the slidable device 30 is at the second position, the slidable device 30 may retract into the housing 10 and further received in the housing 10, such that the slidable device 30 could be hided under the screen 20 and cannot be seen from the outside of the electronic apparatus 100. In this way, it is possible to achieve a diversity of usages of the electronic apparatus 100, and improve the user experience. Optionally, when the slidable device 30 is at the second position, the slidable device 30 may be disposed under the display area 22 of the screen 20, such that at least part of the slidable device 30 may be covered by the display area 22 of the screen 20.

Figure 8:
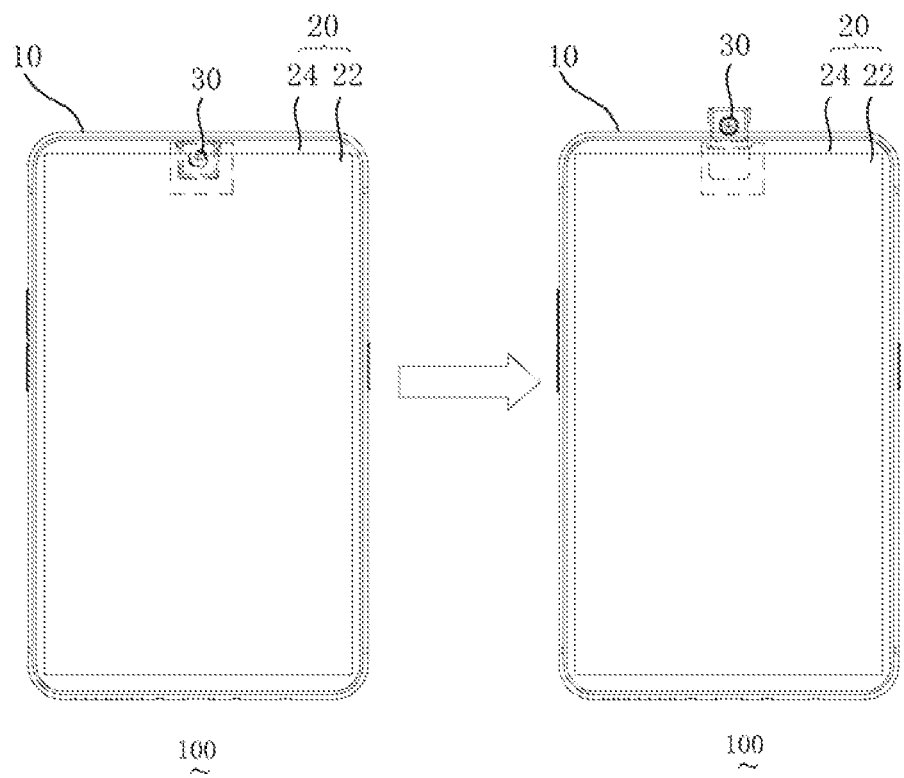
FIG. 8 is a front view of an electronic apparatus according to another embodiment of the present disclosure, wherein the slidable device moves from the second position to the first position.
Figure 9:
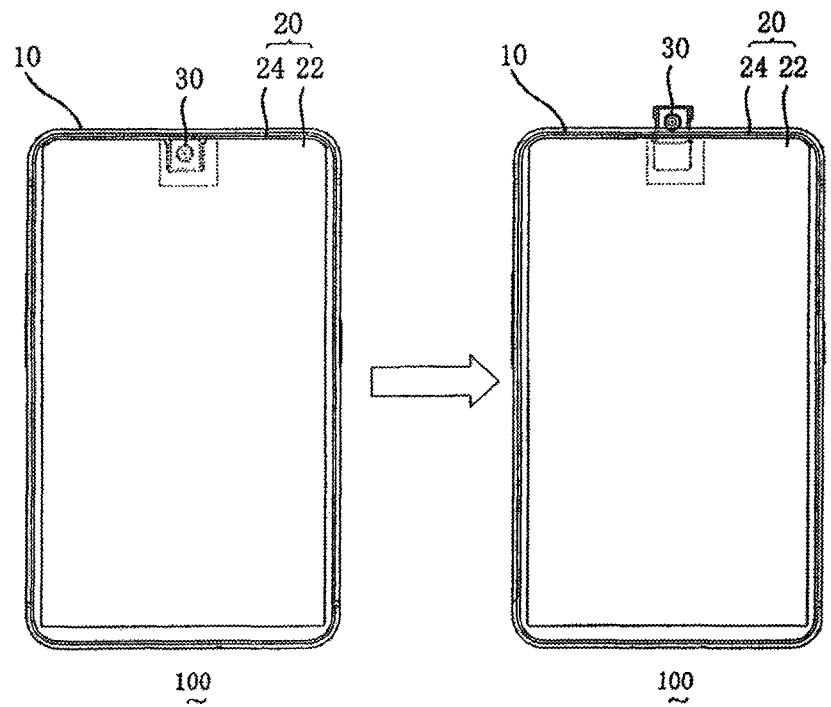
FIG. 9 is a front view of an electronic apparatus according to still another embodiment of the present disclosure, wherein the slidable device moves from the second position to the first position.

Referring to FIGS. 8 and 9, the slidable device 30 moves from the second position to the first position is depicted. As shown in FIG. 8, when the slidable device 30 is at the second position, part of the slidable device 30 may be covered by the display area 22 of the screen 20, while in FIG. 9, when the slidable device 30 is at the second position, whole of the slidable device 30 may be covered by the display area 22 of the screen 20.

Furthermore, since the slidable device 30 is disposed in the housing 10 and under the screen 20, the slidable device 30 may no longer occupy any space of the display area 22, such that the display area 22 could be designed as large as possible, and thus a ratio of the display area 22 to a total area of the screen 20 could be increased. In addition, the volume of the mobile terminal could be reduced, thereby carrying or gripping the mobile terminal could be more convenient.

According to an exemplary embodiment, the slidable device 30 may include, but be not limited to, at least one component selecting from a group including the a camera module, an iris recognition module, a face recognition module, an LED flash, a microphone, a receiver, a photoreceptor, a fingerprint module, and a button.

Figure 10:
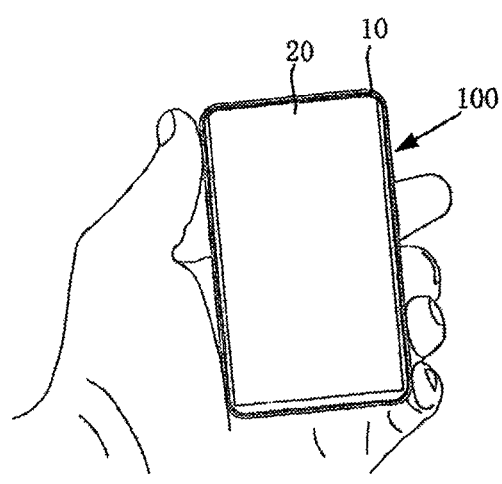
FIG. 10 is a schematic view of an electronic apparatus according to an embodiment of the present disclosure, wherein the slidable device is at the second position.
Figure 11:
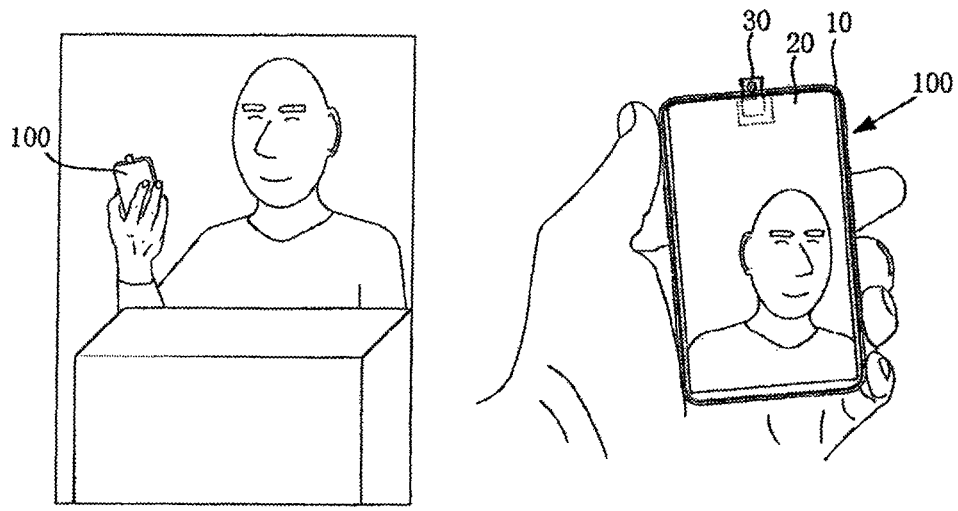
FIG. 11 is a schematic view of an electronic apparatus according to an embodiment of the present disclosure, wherein the slidable device is being used to take images and at the first position.

In an alternative embodiment, the slidable device 30 may be a camera module. Taking the slidable device 30 as a front-facing camera module for example, referring to FIG. 10, the front-facing camera module may be disposed in the housing 10 and hided under the screen 20. Referring to FIG. 11, when a user wants to take images, he may input an instruction of taking images to the electronic apparatus 100. Then the front-facing camera module may be driven to extend out of the housing 10 by the driving mechanism 40 via the through hole 18, an image taking function may be achieved as a result. Besides, the front-facing camera will not occupy the space of the screen 20, and it is unnecessary to define a hole for the front-facing camera on a glass substrate of the screen 20. In this way, a ratio of the display area 22 to an area of the screen 20 may be increased, and manufacturing processes of the screen 20 may be reduced. After finishing taking images, the driving mechanism 40 may drive the front-facing camera to retract into the housing 10 via the through hole 18, and thus the front-facing camera may be protected from being impacted, damaged, eroded by water or dust, and the like.

The driving mechanism 40, according to an exemplary embodiment, may include a fixed holder 42 fixed on the bottom board 12, a magnetic assembly 44, at least part of which may be arranged in the fixed holder 42, and a controller 46 connected to the magnetic assembly 44 via a flexible printed circuit 48.

Figure 12:
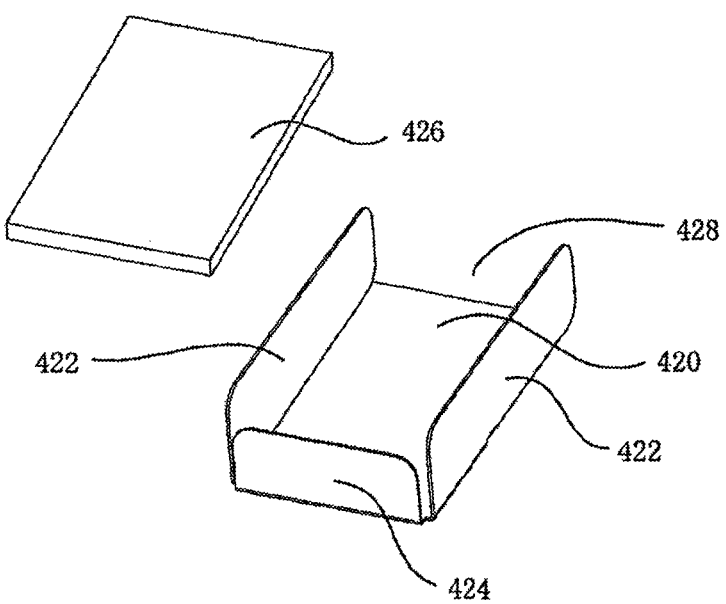
FIG. 12 is a partial disassembly schematic view of a fixed holder according to an embodiment of the present disclosure.
Figure 13:
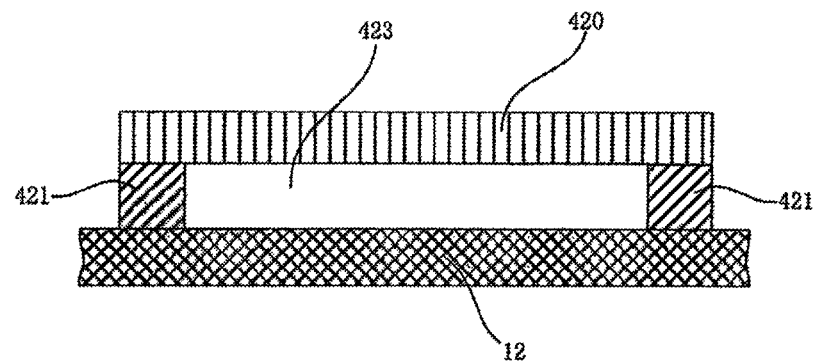
FIG. 13 is a partial cross-section view of a floor plate, a support element and a bottom board according to an embodiment of the present disclosure.

Specifically, referring to FIG. 12 and combining with FIGS. 4 and 7, the fixed holder 42 may have a configuration of rectangle and include a floor plate 420 fixed on the bottom board 12 and end of which may be arranged near the through hole 18, a pair of side plates 422 arranged opposite to each other and connected to the floor plate 420, an end plate 424 connected to the other end of the floor plate 420 away from the through hole 18, and a guiding element configured to guide the movement of the magnetic assembly 44 The floor plate 420 and the pair of side plates 422 may define a first sliding groove 428 along a moving direction of the slidable device 30. In an embodiment, as shown in FIG. 13, the floor plate 420 may be fixed on the bottom board 12 through a support element 421, such that a gap 423 is defined by the floor plate 420 and the bottom board 14.

The magnetic assembly 44 in this embodiment may include, as shown in FIGS. 4 and 7, a first magnetic element 440 fixed on the slidable device 30, a second magnetic element 442 fixed on the end plate 424 and a plurality of third magnetic elements 444 arranged between the first magnetic element 440 and the second magnetic element 442. The first magnetic element 440, the plurality of third magnetic elements 444 and the second magnetic element 442 may be arranged along the moving direction of the slidable device 30 and substantially paralleled to each other. The first magnetic element 440 and the plurality of third magnetic elements 444 may be arranged and move in the sliding groove 428. Optionally, in some embodiments, the magnetic assembly 44 may include the first magnetic element 440 fixed on the slidable device 30 and the second magnetic element 442 fixed on the end plate 424.

In an embodiment, each of the first magnetic element 440, the second magnetic element 442 and the plurality of third magnetic elements 444 may be an electromagnetic element, more specifically, an electromagnetic tab. In this embodiment, the electromagnetic tabs may be substantially perpendicular to the floor plate 426. The guiding element may be configured to limit the state of the plurality of third magnetic elements 444, i.e., the state of being perpendicular to the floor plate 426, such that the plurality of third magnetic elements 214 may be kept substantially paralleled to the second magnetic element 442 during moving in the first sliding groove 428.

Figure 14:
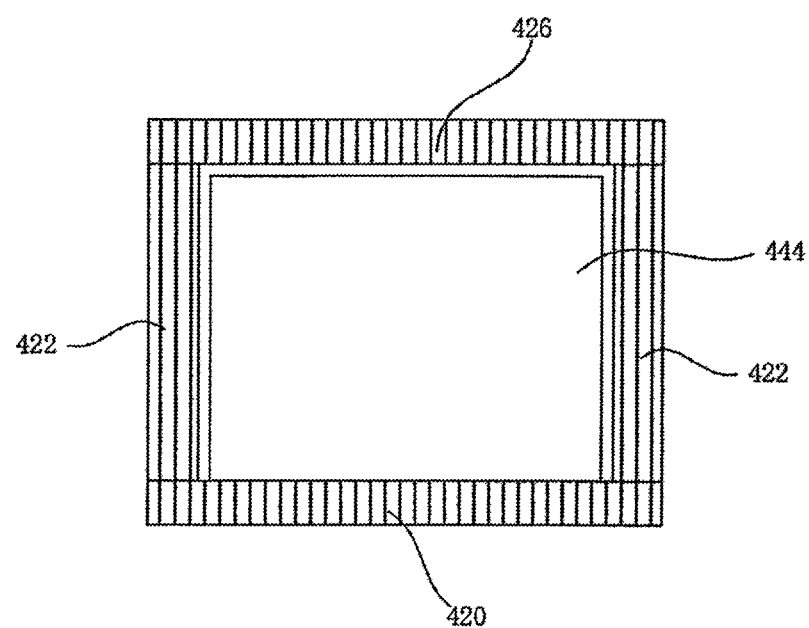
FIG. 14 is a partial cross-section view of the fixed holder in FIG. 5.

In an embodiment, the guiding element may be a top plate 426 arranged opposite to the floor plate 420 and connected to the pair of side plates 422 (shown in FIG. 2). Referring to FIG. 14, a bottom of the plurality of third magnetic elements 444 may contact with the floor plate 420, while the top of the plurality of third magnetic elements 444 may have a clearance fit with the top plate 426. That is, a clearance may be defined by the plurality of third magnetic elements 444 and the top plate 426, such that tops of the plurality of third magnetic elements 444 may not contact with the top plate 426. The clearance between the plurality of third magnetic elements 444 and the top plate 426 may, on one hand, provide a space such that the plurality of third magnetic elements 444 could move smoothly. On the other hand, the clearance may be small enough such that the plurality of third magnetic elements 444 would not fall down. As a result, the plurality of third magnetic elements 444 may be kept substantially paralleled to the second magnetic element 442 by the top plate 426.

Figure 15:
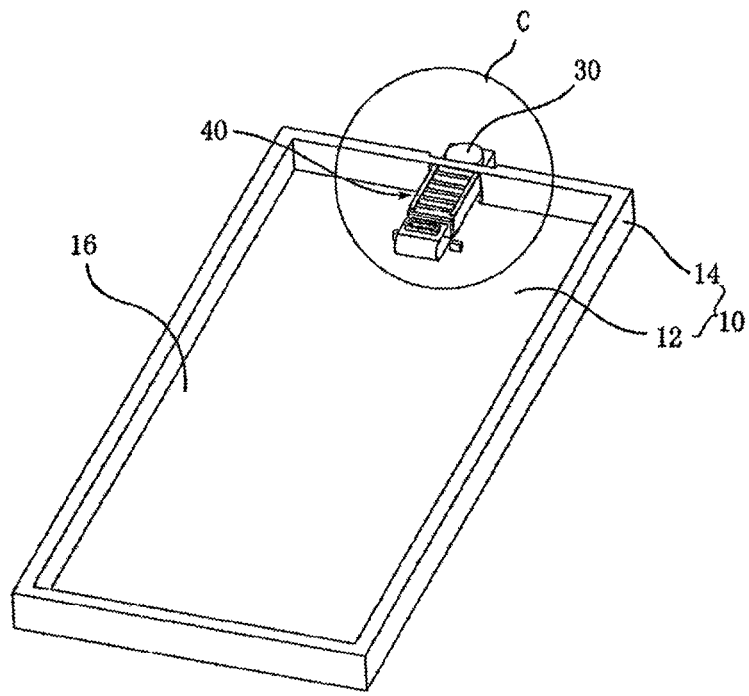
FIG. 15 is a partial schematic view of the electronic apparatus according to another embodiment of the present disclosure, wherein the slidable device is at a first position.
Figure 16:
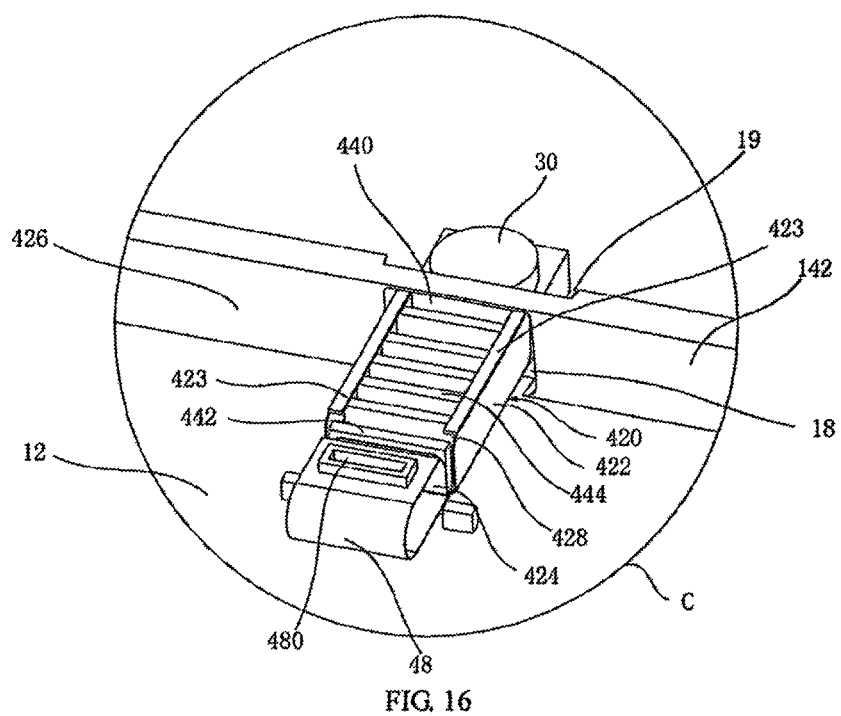
FIG. 16 is an enlarged view of circle C in FIG. 15.
Figure 17:
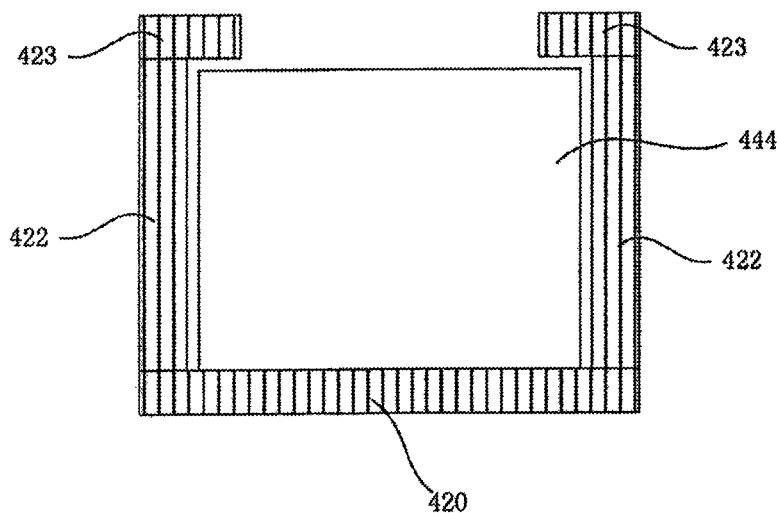
FIG. 17 is a partial cross-section view of the fixed holder in FIG. 15.

In other embodiments, referring to FIGS. 15 to 17, the top plate 426 may be replaced by two guiding strips 423. One of the guiding strips 423 may be arranged on the top of one of the pair of side plates 422. The other one of the guiding strips 423 may be arranged on the top of the other one of the pair of side plates 422. The two guiding strips 423 may be not in contact with each other. The space between the two guiding strips 423 may be great enough to receive the slidable device 30 when the slidable device 30 retracts into the cavity 16. In some embodiments, the two guiding strips 423 and the pair of the side plate 422 may be formed of a single piece. In particularly, the top of each of the pair of the side plate 422 may bended to form the guiding strip 423. In other embodiments, the guiding strip 423 may be fixed on the top of the side plate 422.

Figure 18:
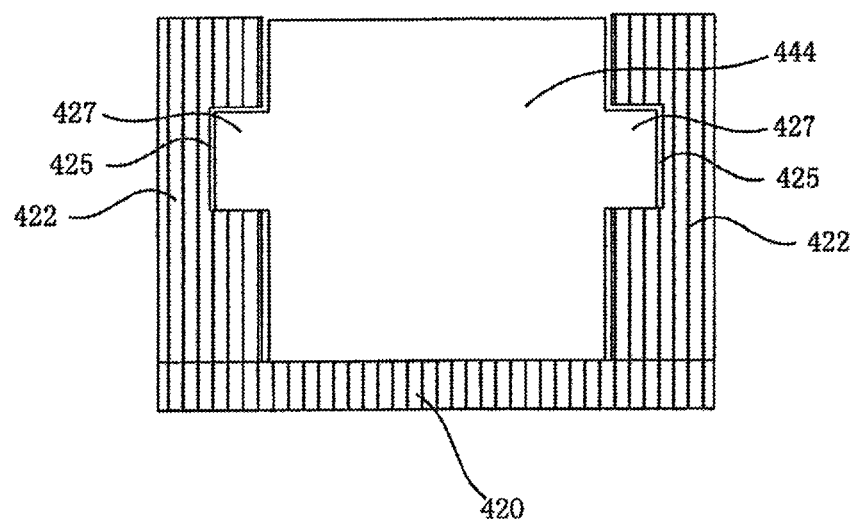
FIG. 18 is a partial cross-section view of the fixed holder according to still another embodiment of the present disclosure.

Referring to FIG. 18, in still other embodiments, each of the two side plates 422 may define a guiding rail 425 extending along the moving direction of the functional component 30. Each side of the at least one third electromagnetic element 444 may be provided with a guiding element 427. The guiding element 427 may be configured to match with the guiding rail 425 to keep the at least one third magnetic element 444 substantially paralleled to the second magnetic element 442 during movement of the at least one third magnetic element. For example, the guiding rail 425 may be a groove extending along the moving direction of the slidable device 30, the guiding element 427 may be a protrusion protruding from each side of the at least one third electromagnetic element 444. The protrusion may be inserted into the groove and match with the groove, and the side plate 422 may limit the state of the at least one third electromagnetic element 444, such that the at least one third electromagnetic element 444 may not fall down.

In this embodiment, thickness of the electromagnetic tab may be small, thus the cavity 16 only needs to provide a relative small space to receive the electromagnetic tabs. In addition, the electromagnetic tab may have a great effective magnetic field area after the current is provided, the magnetic force between two adjacent electromagnetic tabs may also be great. As a result, the slidable device 30 could be driven to extend out or retract into the cavity quickly, and the itinerary of the slidable device 30 may be increased.

Figure 19:
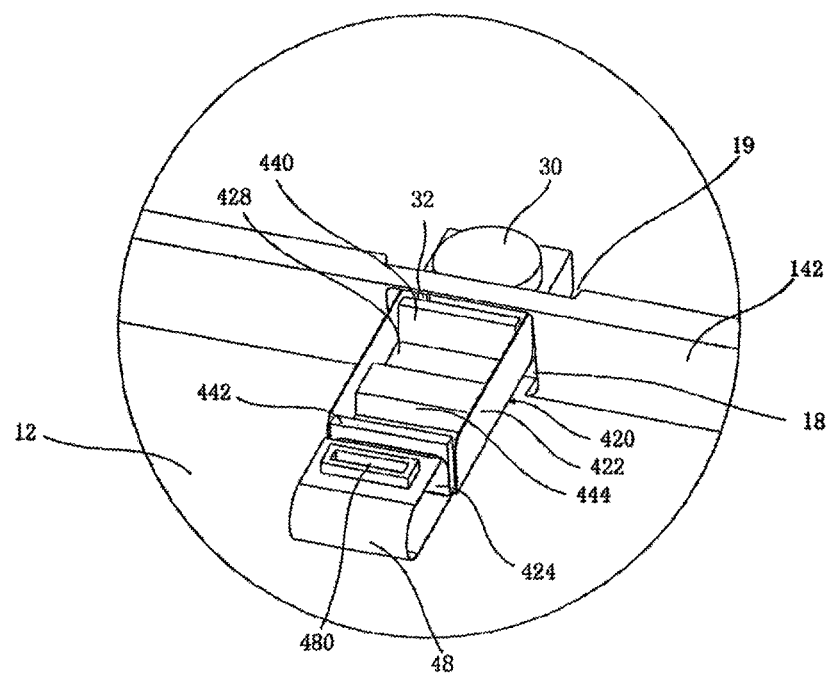
FIG. 19 is a partial enlarged schematic view of an electronic apparatus according still another embodiment of the present disclosure.

In other embodiments, referring to FIG. 19, the at least one third magnetic elements 444 may have a configuration of block. The block may have a width (along the moving direction of the plurality of third magnetic elements 444) greater than a height (along a direction substantially perpendicular to the floor plate 420). Mom specifically, the difference between the width and the height may be peat enough so as to ensure that the plurality of third magnetic elements 444 would not fall down during moving. In this case, the plurality of third magnetic elements 444 may keep substantially paralleled to the second magnetic element 442 during moving because of the block configuration themselves. Therefore, the top plate 426 could be omitted in this case.

Figure 20:
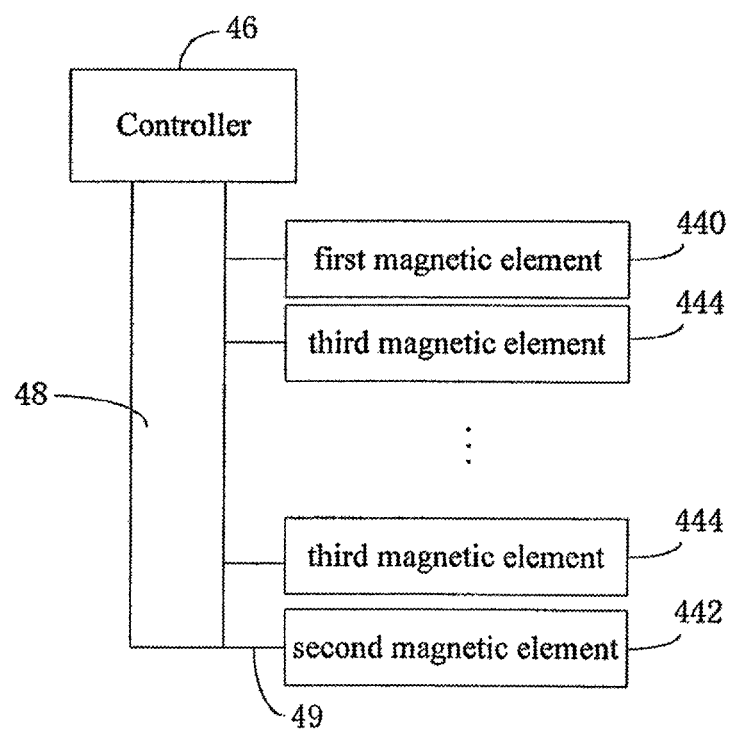
FIG. 20 is a block diagram of the connection between the controller and the magnetic assembly.
Figure 21:
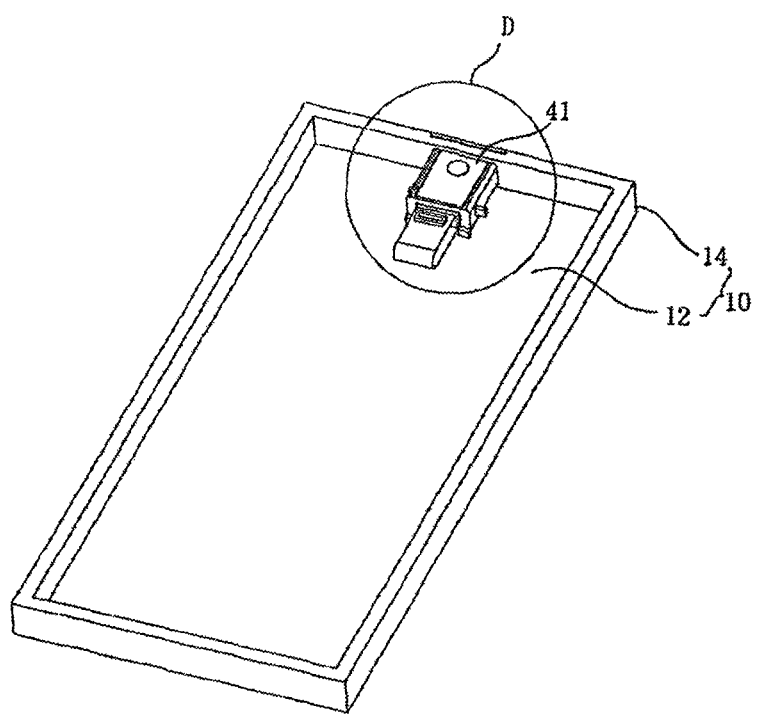
FIG. 21 a partial schematic view of the electronic apparatus according to an embodiment of the present disclosure, wherein the slidable device is at the second position.

Referring to FIG. 20, in this embodiment, direction of current provided in the first magnetic element 440, the second magnetic element 442 and the plurality of third magnetic elements 444 may be controlled by the controller 46, as shown in FIG. 15. Specifically, the controller 46 may be electrically connected to the first magnetic element 440, the second magnetic element 442 and the plurality of third magnetic elements 444 via the flexible printed circuit 48 and flexible cable 49, such that the first, plurality of third and second magnetic elements 440, 442, 444 could receive electric signal from the controller 46. Therefore, separate control of the magnetic poles of the first, plurality of third and second magnetic elements 440, 442, 444 by the controller 46 could be achieved. In an embodiment, the controller 46 may be integrated on the main board of the electronically component 50.

According to an exemplary embodiment, the first magnetic element 440, the second magnetic element 442 and the plurality of third magnetic elements 444 may have a same wiring structure. As shown in FIG. 7, when the user inputs an instruction of starting the slidable device 30, the controller 46 may control direction of current provided to the second magnetic element 442 to be opposite to the direction of current provided to the third magnetic element 444a adjacent to the second magnetic element 442, magnetic poles of the second magnetic element 442 may be, such as N-S, along the moving direction of the slidable device 30, while the magnetic poles of the third magnetic element 444a may be S-N along the moving direction of the slidable device 30. That is, the magnetic pole of the second magnetic element 442 faced to the third magnetic element 444a may be the same as the magnetic pole of the third magnetic element 444a faced to the second magnetic element 442. Therefore, the third magnetic element 444a may be repulsed to the second magnetic element 442 and driven to move away from the second magnetic element 442. Similarly, other third magnetic elements 444 and the first magnetic element 440 may also be repulsed to an adjacent magnetic element and driven to move away from the second magnetic element 442. As a result, the slidable device 30 may be forced to the first position, that is, extend out of the housing 10 via the through hole 18.

As shown in FIG. 4, after using the slidable device 30, the user may input an instruction of turning off the slidable device 30, the controller 46 may change direction of current provided to the second magnetic element 442 to be the same as the direction of current provided to the third magnetic element 444a adjacent to the second magnetic element 442, magnetic poles of the second magnetic element 442 may be, such as S-N, along the moving direction of the slidable device 30, the magnetic poles of the third magnetic element 444a may also be S-N along the moving direction of the slidable device 30. That is, the magnetic pole of the second magnetic element 442 faced to the third magnetic element 444a may be different from the magnetic pole of the third magnetic element 444a faced to the second magnetic element 442. Therefore, the third magnetic element 444a may be attracted to the second magnetic element 442 and driven to move towards the second magnetic element 442. Similarly, other third magnetic elements 444 and the first magnetic element 440 may also be attracted to an adjacent magnetic element and driven to move towards the second magnetic element 442. As a result, the slidable device 30 may be pulled to the second position, that is, retract back into the housing 10 via the through hole 18.

In an embodiment, the slidable device 30 may be kept at the first position by magnetic force (i.e. the repulsive force) generated by the first magnetic element 420, the second magnetic element 422 and the plurality of third magnetic elements 444, without any other locking members. That is, after the slidable device 30 moves to the first position, current may be still provided to the first magnetic element 420, the second magnetic element 422 and the plurality of third magnetic elements 444, such that the repulsive force may be generated continuously. Therefore, the slidable device 30 could be kept at the first position.

When the slidable device 30 is kept at the first position, the first magnetic element 440, the second magnetic element 442 and the plurality of third magnetic elements 444 may keep repulsed to each other and be spaced with each other, such that the slidable device 30 may be kept at the first position, that is, the first magnetic element 440, the plurality of third magnetic elements 444 and the second magnetic element 442 may not be contacted with each other. If the slidable device 30 is subjected to an impact, a space between every two magnetic elements may act as a buffer space to absorb the impact force, which could protect the slidable device 30 from being damaged.

In some embodiments, the slidable device 30 may be kept at the second position by magnetic force (i.e, attractive force) generated by the first magnetic element 440, the second magnetic element 442 and the plurality of third magnetic elements 444. That is, after the slidable device 30 moves to the second position, current may be still provided to the first magnetic element 420, the second magnetic element 422 and the plurality of third magnetic elements 444, such that the attractive force may be generated continuously. Therefore, the slidable device 30 could be kept at the first position.

In other embodiments, after the slidable device 30 retracts to the second position, it may need to provide current to the first magnetic element 420 and the second magnetic element 442, while not to the plurality of third magnetic elements 444. In this case, the first magnetic element 440 and the second magnetic element 442 may be attracted to each other, such that the first magnetic element 440, the plurality of third magnetic elements 444 and the second magnetic element 442 may keep in contact with each other. As a result, the slidable device 30 may be kept at the second position.

In other embodiments, each of the first magnetic element 440 and second magnetic element 442 may be a permanent magnetic element, while the plurality of the third magnetic elements 444 may be electromagnetic elements. A magnetic pole of the first magnetic element 440 faced the second magnetic element 442 and a magnetic pole of the second magnetic element 442 faced the first magnetic element 440 may be different. When there is no current provided to the plurality of the third magnetic elements 444, the first magnetic element 440 may be attracted to the second magnetic element 442 such that the first magnetic element 440, the plurality of third magnetic elements 444 and the second magnetic element 442 may be in contact with each other. As a result, the slidable device 30 may be kept at the second position.

According to an exemplary embodiment, the flexible printed circuit 48 may include a first end and a second end opposite to the first end. The first end may be fixed on the fixed holder 42, specifically, on the top of the end plate 426. A port 480 may be arranged on the first end of the flexible printed circuit 48 and configured to connect the flexible printed circuit 48 to the controller 46 and the main board. The second end may pass through the gap 423 (shown in FIG. 13), extend to the slidable device 30, and be fixed on the slidable device 30.

Referring to FIGS. 21 to 24, in other embodiments, the driving mechanism 40 may further include a sliding seat 41 defining a second sliding groove 416 substantially paralleled to the first sliding groove 428. The fixed holder 42 may be inserted into the second sliding groove 428. The sliding device 30 may be arranged in the second sliding groove 416 and enclosed by the sliding seat 41, such that the sliding device 30 could be protected by the sliding seat 41. Furthermore, the sliding device 30 may be fixed on an end of the sliding seat 41 such that the sliding seat 41 could move with the sliding device 30 relative to the fixed holder 42, as shown in FIGS. 21-22 and 25-26.

Figure 24:
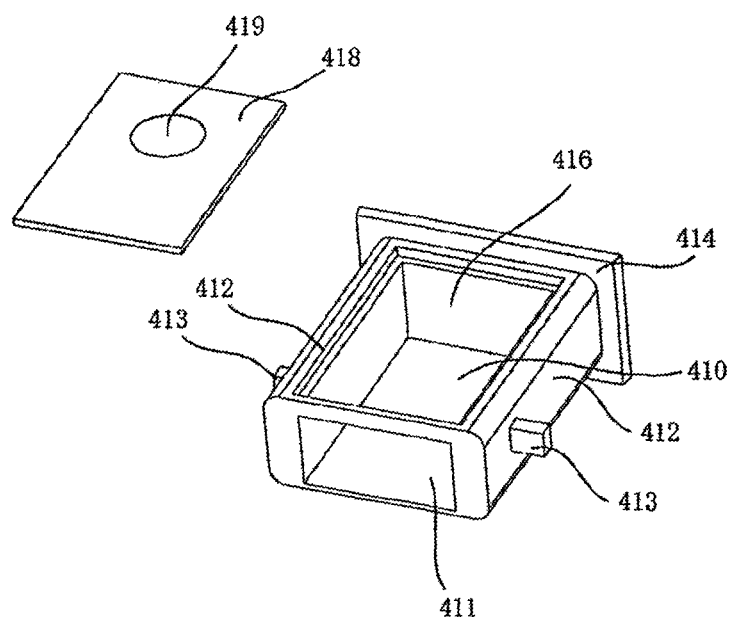
FIG. 24 is a partial disassembly schematic view of a sliding seat according to an embodiment of the present disclosure.
Figure 25:
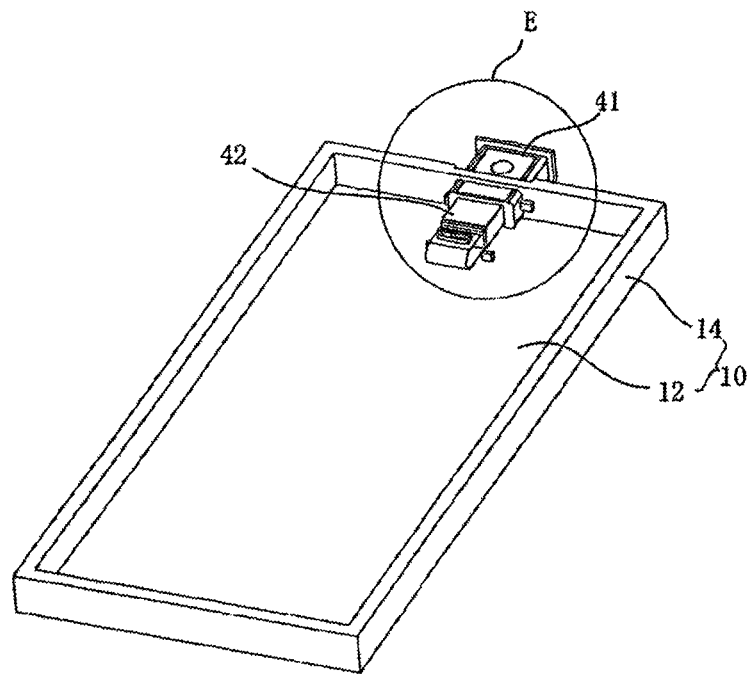
FIG. 25 is a partial schematic view of the electronic apparatus according to an embodiment of the present disclosure, wherein the slidable device is at the first position.

In particularly, the sliding seat 41 may have a configuration of rectangle and include a bottom wall 410, a pair of side walls 412 arranged opposite to each other and connected to the bottom wall 410, a baffle 414 connected to an end of the bottom wall 410 away from the second magnetic element 442 and a cover plate 418 arranged opposite to the bottom wall 410 and substantially paralleled to the bottom wall 410 (shown in FIG. 24). The bottom wall 410, the pair of side walls 412 and the baffle 414 may define the second sliding groove 416. The second sliding groove 416 may have an opening 411 at the end of sliding seat 41 opposite to the-baffle 414. The fixed holder 42 may be inserted into the second sliding groove 416 through the opening 411. The sliding device 30 may be received in the second sliding groove 416 and fixed on the baffle 414. More specifically, there may be a gap defined by the sliding device 30 and the bottom wall 410, and a gap defined by the sliding device 30 and the pair of side walls 412, such that inserting the fixed holder 42 into the second sliding groove 416 could be realized. The cover plate 418 may cover the second sliding groove 416 and the sliding device 30.

In this embodiment, the bottom wall 410, an outer surface of the fixed holder 42 may have a clearance fit with an inner surface of the sliding seat 41, such that the sliding seat 41 could move relative to the fixed holder 42 smoothly. Furthermore, an outer surface of the sliding seat 41 may have a clearance fit with an inner surface of the through hole 18, such that the sliding seat 41 could move out of the housing smoothly.

In some embodiments, a signal penetrating portion 419 may be provided in the cover plate 418, such that the slidable device 30 arranged in the sliding seat 41 could receive the signal. According to an exemplary embodiment, the functional component may be a camera. The sliding seat 41 may provide a darkroom for the camera, while the signal penetrating portion 419 may be a light hole for ambient light to pass through to reach the camera.

Figure 22:
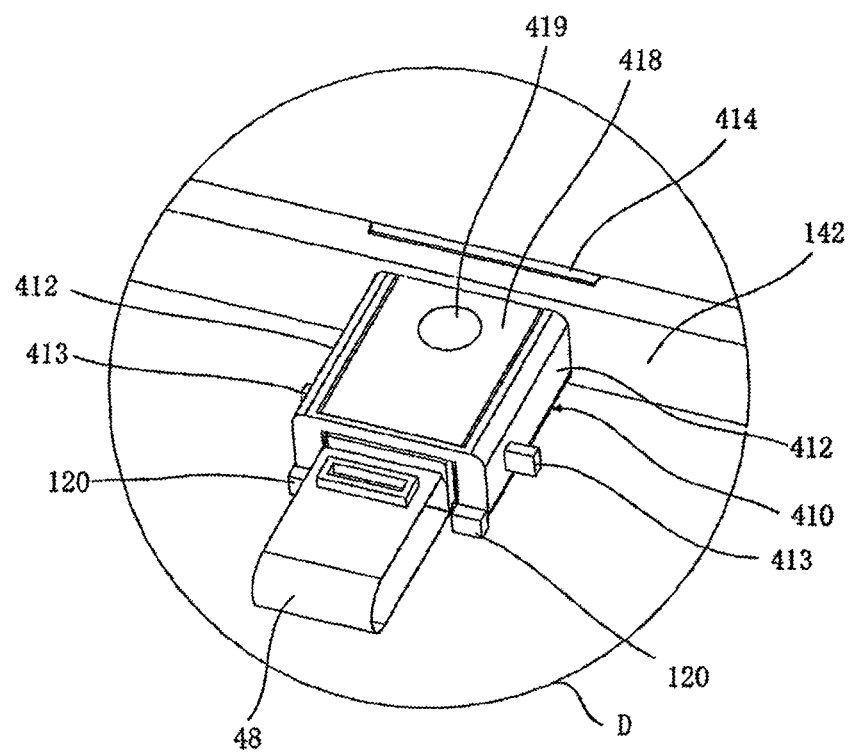
FIG. 22 is an enlarged view of circle D in FIG. 21.
Figure 23:
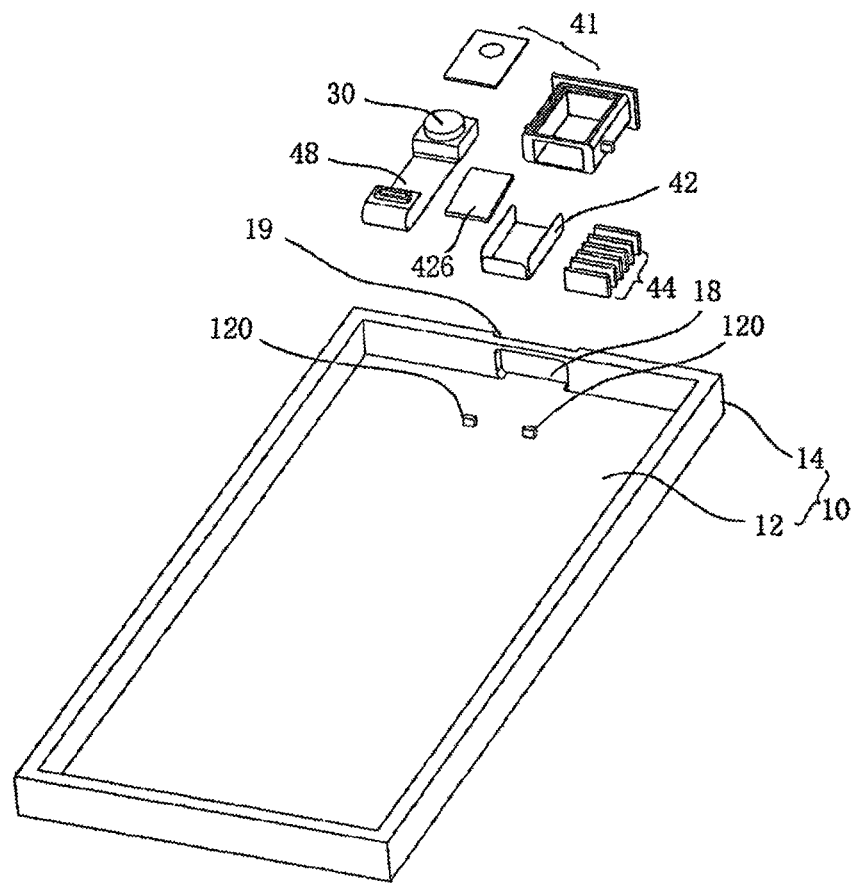
FIG. 23 is an exploded isometric view of the electronic apparatus of FIG. 21.
Figure 26:
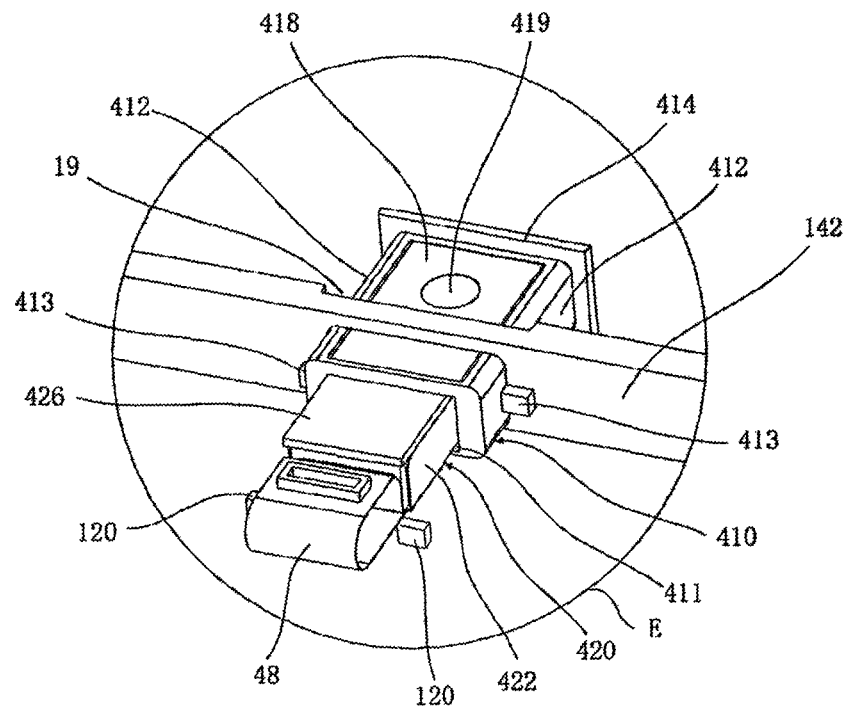
FIG. 26 is an enlarged view of circle E in FIG. 25.

In some embodiments, the baffle 414 may be positioned outside of the housing 10 and have a shape similar with the shape of the slot 19 (shown in FIGS. 22 and 26). When the slidable device 30 is at the second position, the sliding seat 41 may be received in the housing, the baffle 414 may match with an inner wall of the slot 19, such that the baffle 414 may cover the through hole 18. Therefore, the baffle 414 could prevent external impurities, such as, dust, liquid or the like, from entering into the cavity 16. Furthermore, the outer surface of the baffle 414 may be flush with the outer surface of the first housing wall 142. As a result, the electronic apparatus 100 could have a simple appearance.

In this embodiment, since the sliding device 30 is enclosed by the sliding seat 41, the stop protrusion 32 arranged on the sliding device 30 could be omitted. Instead, a first stop protrusion 413 may be arranged on an outer surface of each of the pair of side walls 412. The first stop protrusion 413 may be configured to match with the first housing wall 142 to stop the movement of sliding seat 41 when the slidable device 30 moves to the first position, so as to stop the movement of the slidable device 30. For example, the sliding seat 41 may move with the extending of the slidable device 30, when the slidable device 30 moves to the first position, the first stop protrusion 413 may abut against the first housing wall 142 (shown in FIGS. 25 and 26), and at this time, the sliding seat 41 may be stopped from moving by the first stop protrusion 413, such that the slidable device 30 may be stopped from moving.

In some embodiments, two second stop protrusions 120 may be provided on the bottom board 12 of the housing 10. One of the second stop protrusions 120 may be arranged near one of the side walls 412, the other one of the second stop protrusions 120 may be arranged near the other one of the side walls 412. Each of the two second stop protrusions 120 may be configured to match with a corresponding side wall 412 to stop the movement of the sliding seat 41 when the slidable device 30 moves to the second position, so as to stop the movement of the slidable device 30. For example, the sliding seat may move with the retracting of the slidable device 30, when the slidable device 30 moves to the second position, an end of each of the side wall 412 may abut against a corresponding second stop protrusion 120 (shown in FIGS. 21 and 22), and at this time, the sliding seat 41 may be stopped from moving by the second stop protrusion 413, such that the slidable device 30 may be stopped from moving.

In one aspect of the present disclosure, a functional device may be provided. The functional device may include a base defining a cavity, a functional component received in the cavity and configured to move between a first position at which the functional component extends out of the cavity and a second position at which the functional component retracts into the cavity, and a magnetic assembly received in the cavity and including a first magnetic element fixed on the functional component, a second magnetic element fixed on the base and at least one third magnetic element arranged between the first magnetic element and the second magnetic element. The first magnetic element, the at least one third magnetic element and the second magnetic element may be arranged along a moving direction of the functional component. When each of the first, second, and at least one third magnetic elements is repulsed to an adjacent magnetic element, the first magnetic element and the at least one third magnetic element may move away from the second magnetic element such that the functional component may be forced to the first position. When each of the first, second, and at least one third magnetic elements is attracted to the adjacent one, the first magnetic element and the at least one third magnetic element may move towards the second magnetic element such that the functional component may be pulled to the second position.

In one embodiment, the functional component may be kept at the first position by repulsive force generated by the first, second, and at least one third magnetic elements.

In another embodiment, functional device may further include a fixed holder, the fixed holder may include a floor plate fixed on the base, a pair of side plates arranged opposite to each other and connected to the floor plate. The floor plate and the pair of side plates may define a first sliding groove along a moving direction of the functional component. The first magnetic element and the at least one third magnetic element may be arranged and move in the first sliding groove. The first magnetic element, the at least one third magnetic element and the second magnetic element may be substantially paralleled to each other.

In still another embodiment, the fixed holder may further include a guiding element arranged opposite to the floor plate and connected to at least one of the pair of side plates, the guiding element may be configured to keep the at least one third magnetic element substantially paralleled to the second magnetic element during movement of the at least one third magnetic element.

In further embodiment, each of the two side plates may define a guiding rail extending along the moving direction of the functional component; each side of the at least one third electromagnetic element may be provided with a guiding element; the guiding element may be configured to match with the guiding rail to keep the at least one third magnetic element substantially paralleled to the second magnetic element during movement of the at least one third magnetic element.

In an embodiment, the functional device may include a sliding seat defining a second sliding groove substantially paralleled to the first sliding groove. The fixed holder may be inserted into the second sliding groove. The functional component may be arranged in the second sliding groove and fixed on an end of the sliding seat away from the second magnetic element, such that the sliding seat may be capable of moving with the functional component relative to the fixed holder.

In other embodiments, the sliding seat may include a bottom wall, a pair of side walls arranged opposite to each other and connected to the bottom wall, and a baffle connected to an end of the bottom wall away from the second magnetic element. The bottom wall, the baffle and the pair of side walls may define the second sliding groove. The functional component may be fixed on the baffle. The base may include a bottom board and a side board connected to and surrounding the bottom board. The bottom board and the side board may define the cavity. The side board may define a through hole, the functional component may extend out of the cavity or retracts into the cavity via the through hole. The baffle may be positioned outside of the base and configured to cover the through hole when the functional component is at the second position.

In an embodiment, the sliding seat may further include a cover plate arranged opposite to the bottom wall and covering the functional component, a signal penetrating portion may be provided in the cover plate.

In an embodiment, a first stop protrusion may be arranged on an outer surface of each of the pair of side walls, the first stop protrusion may be configured to match with the side board to stop the movement of the sliding seat when the functional component is extending out of the cavity.

In an embodiment, at least one second stop protrusion may be arranged on the bottom board. The at least one second stop protrusion may be configured to stop the movement of the sliding seat when the functional component is retracting into the cavity.

In some embodiments, the functional device may include a flexible printed circuit received in the base. The floor plate may be fixed on the bottom board through a support element such that a gap may be defined by the floor plate and the bottom board. An end of the flexible printed circuit may be connected to the fixed holder, the other end of the flexible printed circuit may extend through the gap and be connected to the functional component.

In another embodiment, each of the magnetic elements may be an electromagnetic element.

In still another embodiment, the electromagnetic element may be an electromagnetic tab.

In an embodiment, at least one stop protrusion may be arranged on the functional component. The at least one stop protrusion may be configural to match with the base to stop the movement of the functional component when the functional component is extending out of the cavity.

In an embodiment, the functional component may be kept at the second position by attractive force generated at least by the first magnetic element and the second magnetic element.

In another aspect of the present disclosure, an electronic apparatus may be provided. The electronic apparatus may include a housing, a screen engaged with the housing to define a chamber, a slidable device received in the chamber and configured to move between a first position at which the slidable device extends out of the chamber and a second position at which the slidable device retracts into the chamber and is covered by the screen, and a magnetic assembly received in the chamber and including a first magnetic element fixed on the slidable device and a second magnetic element fixed on the housing. The first magnetic element and the second magnetic element may be arranged along a moving direction of the slidable device. When the first magnetic element is repulsed to the second magnetic element, the first magnetic element may move away from the second magnetic element such that the slidable device may be driven to move to the first position. When the first magnetic element is attracted to the second magnetic element, the first magnetic element may move towards the second magnetic element such that the slidable device may be driven to move to the second position.

In an embodiment, the slidable device may be kept at the first position by repulsive force generated by the first magnetic element and the second magnetic element.

In an embodiment, the slidable device may be kept at the second position by attractive force generated by the first magnetic element and the second magnetic element.

In another embodiment,each of the magnetic elements may be an electromagnetic tab.

In still another aspect of the present disclosure, a mobile terminal may be provided. The mobile terminal may include a front shell, a back shell connected to the front shell, a screen embedded in the front shell and covering the back shell, the screen having a display area, and a driving mechanism, received in the back shell. The driving mechanism may include a first electromagnetic element fixed on the slidable device, a second electromagnetic element fixed on the back shell, at least one third electromagnetic element arranged between the first electromagnetic element and the second electromagnetic element, and a controller electrically connected to the first electromagnetic element, the second electromagnetic element and the at least one third electromagnetic element. The first electromagnetic element, the at least one third electromagnetic element and the second electromagnetic element may be arranged along a moving direction of the slidable device. The controller may be configured to control direction of current provided to the first, second and at least one third electromagnetic elements to exchange magnetic poles of each of the first, second and at least one third electromagnetic elements, such that each of the first, second and at least one third electromagnetic elements may be repulsed or attracted to an adjacent electromagnetic element to drive the slidable device to move between the first position and the second position.

In an embodiment, the slidable device may be kept at the first position by repulsive force generated by the first, second and at least one third electromagnetic elements. The slidable device may be kept at the second position by attractive force generated at least by the first magnetic element and the second magnetic element.

For one skilled in the art, it is clear that the present application is not limited to the details of the above exemplary embodiments, and that the present application can be implemented in other specific forms without deviating from the spirit or basic characteristics of the application. Therefore, at any point, the embodiments should be regarded as exemplary and unrestrictive, and the scope of the present application is defined by the appended claims, rather than the above description. Therefore, all changes within the meaning and scope of the equivalent elements of the claim is intended to be included. Any appended label recited in the claims shall not be regarded as a limitation to the claims. In addition, apparently, the terms "include", "comprise" and the like do not exclude other units or steps, and the singular does not exclude plural.

It should be noted that, the foregoing disclosed is merely exemplary implementations and it is not intended to limit the scope of the present disclosure. Although the present disclosure is described in details with reference to the above embodiments, however, one skilled in the art may make any modification or equivalence based on the technical solution and the inventive concept of the present disclosure. All these modifications and equivalences shall all be covered within the protection claimed in the claims of the present disclosure.

What is claimed is:

1. A functional device, comprising:
a base, defining a cavity;
a functional component, received in the cavity and configured to move between a first position at which the functional component extends out of the cavity and a second position at which the functional component retracts into the cavity; and
a magnetic assembly, received in the cavity and comprising a first magnetic element fixed on the functional component, a second magnetic element fixed on the base and at least one third magnetic element arranged between the first magnetic element and the second magnetic element, wherein the first magnetic element, the at least one third magnetic element and the second magnetic element are arranged along a moving direction of the functional component;
wherein when each of the first, second, and at least one third magnetic elements is repulsed to an adjacent magnetic element, the first magnetic element and the at least one third magnetic element move away from the second magnetic element such that the functional component is forced to the first position; when each of the first, second, and at least one third magnetic elements is attracted to the adjacent magnetic element, the first magnetic element and the at least one third magnetic element move towards the second magnetic element such that the functional component is pulled to the second position.

2. The functional device according to claim 1, wherein the functional component is kept at the first position by repulsive force generated by the first, second, and at least one third magnetic elements.

3. The functional device according to claim 2, further comprising a fixed holder, wherein the fixed holder comprises a floor plate fixed on the base, a pair of side plates arranged opposite to each other and connected to the floor plate, wherein the floor plate and the pair of side plates define a first sliding groove along a moving direction of the functional component;
the first magnetic element and the at least one third magnetic element are arranged and move in the first sliding groove; the first magnetic element, the at least one third magnetic element and the second magnetic element are substantially paralleled to each other.

4. The functional device according to claim 3, wherein the fixed holder further comprises a guiding element arranged opposite to the floor plate and connected to at least one of the pair of side plates, the guiding element is configured to keep the at least one third magnetic element substantially paralleled to the second magnetic element during movement of the at least one third magnetic element.

5. The functional device according to claim 3, wherein each of the two side plates defines a guiding rail extending along the moving direction of the functional component;
each side of the at least one third electromagnetic element is provided with a guiding element;
the guiding element is configured to match with the guiding rail to keep the at least one third magnetic element substantially paralleled to the second magnetic element during movement of the at least one third magnetic element.

6. The functional device according to claim 3, further comprising a sliding seat defining a second sliding groove substantially paralleled to the first sliding groove, wherein the fixed holder is inserted into the second sliding groove, the functional component is arranged in the second sliding groove and fixed on an end of the sliding seat away from the second magnetic element such that the sliding seat is capable of moving with the functional component relative to the fixed holder.

7. The functional device according to claim 6, wherein the sliding seat comprises a bottom wall, a pair of side walls arranged opposite to each other and connected to the bottom wall, and a baffle connected to an end of the bottom wall away from the second magnetic element, the bottom wall, the baffle and the pair of side walls define the second sliding groove, the functional component is fixed on the baffle;
the base comprises a bottom board and a side board connected to and surrounding the bottom board, the bottom board and the side board define the cavity, the side board defines a through hole and the functional component extends out of the cavity or retracts into the cavity via the through hole;
the baffle is positioned outside of the base and configured to cover the through hole when the functional component is at the second position.

8. The functional device according to claim 7, wherein the sliding seat further comprises a cover plate arranged opposite to the bottom wall and covering the functional component, a signal penetrating portion is provided in the cover plate.

9. The functional device according to claim 7, wherein a first stop protrusion is arranged on an outer surface of each of the pair of side walls, the first stop protrusion is configured to match with the side board to stop the movement of the sliding seat when the functional component is extending out of the cavity.

10. The functional device according to claim 7, wherein at least one second stop protrusion is arranged on the bottom board, the at least one second stop protrusion is configured to stop the movement of the sliding seat when the functional component is retracting into the cavity.

11. The functional device according to claim 7, further comprising a flexible printed circuit received in the base;
wherein the floor plate is fixed on the bottom board through a support element such that a gap is defined by the floor plate and the bottom board, an end of the flexible printed circuit is fixed on the fixed holder, the other end of the flexible printed circuit extends through the gap and is connected to the functional component.

12. The functional device according to claim 2, wherein each of the magnetic elements is an electromagnetic element.

13. The functional device according to claim 2, wherein at least one stop protrusion is arranged on the functional component, the at least one stop protrusion is configured to match with the base to stop the movement of the functional component when the functional component is extending out of the cavity.

14. The functional device according to claim 2, wherein the functional component is kept at the second position by attractive force generated at least by the first magnetic element and the second magnetic element.

15. An electronic apparatus, comprising:
a housing;
a screen engaged with the housing to define a chamber;
a slidable device, received in the chamber and configured to move between a first position at which the slidable device extends out of the chamber and a second position at which the slidable device retracts into the chamber and is covered by the screen; and
a magnetic assembly, received in the chamber and comprising a first magnetic element fixed on the slidable device, a second magnetic element fixed on the housing and at least one third magnetic element arranged between the first magnetic element and the second magnetic element, wherein the first magnetic element, the second magnetic element and the at least one third magnetic element are arranged along a moving direction of the slidable device;
wherein when each of the first, second, and at least one third magnetic elements is repulsed to an adjacent magnetic element, the first magnetic element and the at least one third magnetic element moves away from the second magnetic element such that the slidable device is driven to move to the first position;
when each of the first, second, and at least one third magnetic elements is attracted to the adjacent magnetic element, the first magnetic element and the at least one third magnetic element moves towards the second magnetic element such that the slidable device is driven to move to the second position.

16. The electronic apparatus according to claim 15, wherein the slidable device is kept at the first position by repulsive force generated by the first, second, and at least one third magnetic elements.

17. The electronic apparatus according to claim 16, wherein the slidable device is kept at the second position by attractive force generated at least by the first magnetic element and the second magnetic element.

18. The electronic apparatus according to claim 15, wherein each of the magnetic elements is an electromagnetic tab.

19. A mobile terminal, comprising:
a front shell;
a back shell connected to the front shell;
a screen embedded in the front shell and covering the back shell, the screen having a display area;
a slidable device, configured to move between a first position at which the slidable device extends out of the back shell and a second position at which the slidable device retracts into the back shell, wherein when the slidable device is at the second position, at least part of the slidable device is covered by the display area; and
a driving mechanism, received in the back shell and comprising:
a first electromagnetic element fixed on the slidable device;
a second electromagnetic element fixed on the back shell;
at least one third electromagnetic element arranged between the first electromagnetic element and the second electromagnetic element; and
a controller, electrically connected to the first electromagnetic element, the second electromagnetic element and the at least one third electromagnetic element;
wherein the first electromagnetic element, the at least one third electromagnetic element and the second electromagnetic element are arranged along a moving direction of the slidable device, the controller is configured to control direction of current provided to the first, second and at least one third electromagnetic elements to exchange magnetic poles of each of the first, second and at least one third electromagnetic elements, such that each of the first, second and at least one third electromagnetic elements is repulsed or attracted to an adjacent electromagnetic element to drive the slidable device to move between the first position and the second position.

20. The mobile terminal according to claim 19, wherein the slidable device is kept at the first position by repulsive force generated by the first, second and at least one third electromagnetic elements;

the slidable device is kept at the second position by attractive force generated at least by the first magnetic element and the second magnetic element.

\* \* \* \* \*